US007443254B2

(12) United States Patent
Gong (10) Patent No.: US 7,443,254 B2
(45) Date of Patent: Oct. 28, 2008

(54) RELAXATION OSCILLATOR WITH PROPAGATION DELAY COMPENSATION FOR IMPROVING THE LINEARITY AND MAXIMUM FREQUENCY

(75) Inventor: Xiaowu Gong, Singapore (SG)

(73) Assignee: Infineon Technologies AG, Munich (DE)

( * ) Notice: Subject to any disclaimer, the term of this patent is extended or adjusted under 35 U.S.C. 154(b) by 31 days.

(21) Appl. No.: 10/559,638

(22) PCT Filed: Jun. 3, 2003

(86) PCT No.: PCT/SG03/00137

§ 371 (c)(1),
(2), (4) Date: Dec. 2, 2005

(87) PCT Pub. No.: WO2004/107576

PCT Pub. Date: Dec. 9, 2004

(65) Prior Publication Data

US 2007/0103243 A1 May 10, 2007

(51) Int. Cl.
*H03K 3/26* (2006.01)
(52) U.S. Cl. .................... 331/111; 331/34; 331/16; 331/143; 327/261
(58) Field of Classification Search ............. 331/16, 331/111, 143, 34; 327/261
See application file for complete search history.

(56) References Cited

U.S. PATENT DOCUMENTS 5,497,127 A   3/1996   Sauer

FOREIGN PATENT DOCUMENTS

| DE | 43 409 24 | 6/1995 |
| JP | 07038388 | 2/1995 |

OTHER PUBLICATIONS

Shakiba M. H. et al., "Automatic Swing Control in Relaxation Oscillators," IEEE Inc. New York, US, vol. 33, No. 12, Dec. 1998, pp. 1979-1986, (8 pages).

*Primary Examiner*—Arnold Kinkead
(74) *Attorney, Agent, or Firm*—Maginot, Moore & Beck (57) ABSTRACT

A tunable oscillator comprises a control supply configured to output a control output operable to tune the tunable oscillator. The tunable oscillator further comprises an oscillator circuit configured to output a signal such that a frequency of the signal increases with increasing control output. A control circuit is configured to control the frequency of the oscillator circuit signal in response to a comparison of the oscillator circuit signal with a reference signal. A propagation delay compensation circuit is configured to vary an amplitude of the reference signal at substantially the same frequency as the oscillator circuit signal to compensate for propagation delay of signals from the control circuit to the oscillator circuit.

19 Claims, 10 Drawing Sheets

RELAXATION OSCILLATOR WITH PROPAGATION DELAY COMPENSATION FOR IMPROVING THE LINEARITY AND MAXIMUM FREQUENCY

FIELD OF THE INVENTION

The present invention relates to tunable oscillators and, more particularly, to the self-calibration of tunable oscillators to produce constant gain over a wide tuning range.

BACKGROUND OF THE INVENTION

Many electrical and computer applications and components have critical timing requirements that compel generation of periodic clock waveforms that are precisely synchronized with a reference clock waveform. A phase-locked loop ("PLL") is one type of circuit that is widely used to provide an output signal having a precisely controlled frequency that is synchronous with the frequency of a reference or input signal. Wireless communication devices, frequency synthesizers, multipliers and dividers, single and multiple clock generators, and clock recovery circuits are but a few examples of the manifold implementations of PLLs.

Frequency synthesis is a particularly common technique used to generate a high frequency clock from a lower frequency reference clock. In microprocessors, for example, an on-chip PLL can multiply the frequency of a low frequency input (off-chip) clock, typically in the range of 1 to 4 MHz, to generate a high frequency output clock, typically in the range of 10 to over 200 MHz, that is precisely synchronized with the lower frequency external clock. Another common use of PLLs is recovery of digital data from serial data streams by locking a local clock signal onto the phase and frequency of the data transitions. The local clock signal is then used to clock a flip-flop or latch receiving input from the serial data stream.

Figure 1:
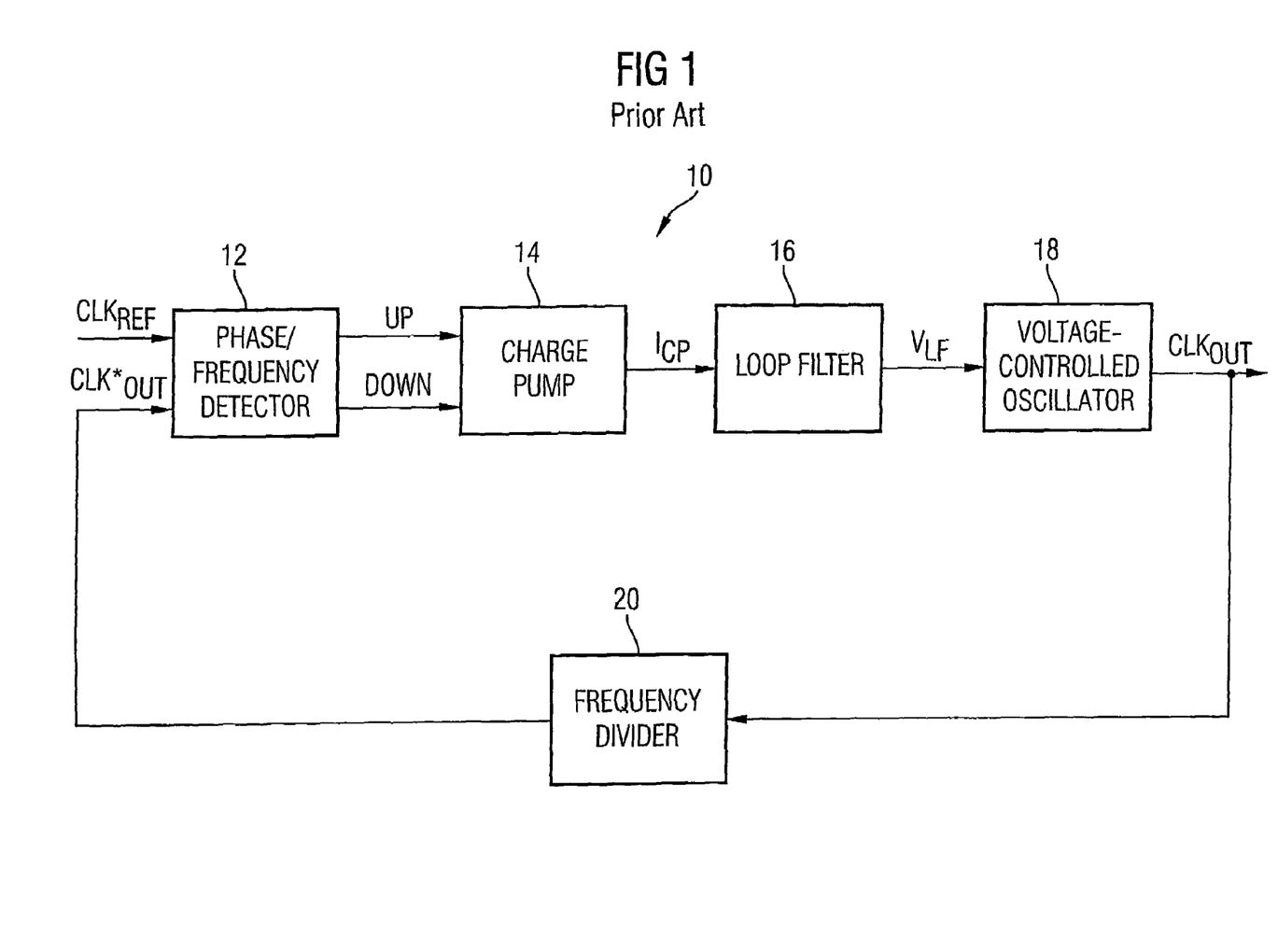
FIG. 1 is a block diagram illustrating the architecture of a typical phase-locked loop.

FIG. 1 is a block diagram of a typical PLL 10. The PLL 10 comprises a phase/frequency detector 12, a charge pump 14, a loop filter 16, a voltage-controlled oscillator ("VCO") 18 and frequency divider 20. The VCO can be a current-controlled oscillator ("CCO") having input provided by a voltage-to-current converter as will be appreciated by those skilled in the art. The PLL 10 receives a reference clock signal $CLK_{REF}$ and generates an output clock signal $CLK_{OUT}$ aligned to the reference clock signal in phase. The output clock frequency is typically an integer (N) multiple of the reference clock frequency; with the parameter N set by the frequency divider 20. Hence, for each reference signal period, there are N output signal periods.

The phase/frequency signal detector 12 receives on its input terminals two clock signals $CLK_{REF}$ and $CLK*_{OUT}$ ($CLK_{OUT}$, with its frequency divided down by the frequency divider 20). In a conventional arrangement, detector 12 is a rising edge detector that compares the rising edges of the two clock signals. Based on this comparison, the detector 12 generates one of three states. If the phases of the two signals are aligned, the loop is "locked". Neither the UP nor the DOWN signal is asserted and VCO 18 continues to oscillate at the same frequency. If $CLK_{REF}$ leads $CLK*_{OUT}$, than the VCO 18 is oscillating too slowly and the detector 12 outputs an UP signal proportional to the phase difference between $CLK_{REF}$ and $CLK*_{OUT}$. Conversely, if $CLK_{REF}$ lags $CLK*_{OUT}$, than the VCO 18 is oscillating too quickly and the detector 12 outputs a DOWN signal proportional to the phase difference between $CLK_{REF}$ and $CLK*_{OUT}$. The UP and DOWN signals typically take the form of pulses having a width or duration corresponding to the timing difference between the rising edges of the reference and output clock signals.

The charge pump 14 generates a current $I_{CP}$ that controls the oscillation frequency of the VCO 18. $I_{CP}$ is dependent on the signal output by the phase/frequency detector 12. If the charge pump 14 receives an UP signal from detector 12, indicating that $CLK_{REF}$ leads $CLK*_{OUT}$, $I_{Cp}$ is increased. If the charge pump 14 receives a DOWN signal from the detector 12, indicating that $CLK_{REF}$ lags $CLK*_{OUT}$, $I_{CP}$ is decreased. If neither an UP nor a DOWN signal is received, indicating that the clock signals are aligned, the charge pump 14 does not adjust $I_{CP}$.

The loop filter 16 is positioned between the charge pump 14 and the VCO 18. Application of the charge pump output current $I_{CP}$ to the loop filter 16 develops a voltage $V_{LF}$ across the filter 16. $V_{LF}$ is applied to the VCO 18 (or to a voltage-to-current converter which then supplies a current to a CCO) to control the frequency of the output clock signal. The filter 16 also removes out-of-band, interfering signals before application of $V_{LF}$ to the VCO 18. A common configuration for a loop filter in a PLL is a simple single-pole, low-pass filter that can be realized with a single resistor and capacitor.

The output clock signal is also looped back through (in some applications) the frequency divider 20. The resultant $CLK*_{OUT}$ is provided to the phase/frequency detector 12 to facilitate the phase-locked loop operation. The frequency divider 20 facilitates comparison of the generally higher frequency output clock signal with the lower frequency reference clock signal by dividing the frequency of $CLK*_{OUT}$ by the multiplication factor N. The divider 20 may be implemented using trigger flip-flops, or through other methods familiar to those of ordinary skill in the art. Thus, the PLL 10 compares the reference clock phase to the output clock phase and eliminates any detected phase difference between the two by adjusting the frequency of the output clock.

In the prior art there have been many different designs for tunable oscillators for use in such PLL circuits as well as other applications. It is often desirable for the tunable oscillator to have linear gain over a large frequency bandwidth extending to high frequencies, but prior-art designs have not been fully successful in this regard.

Figure 2:
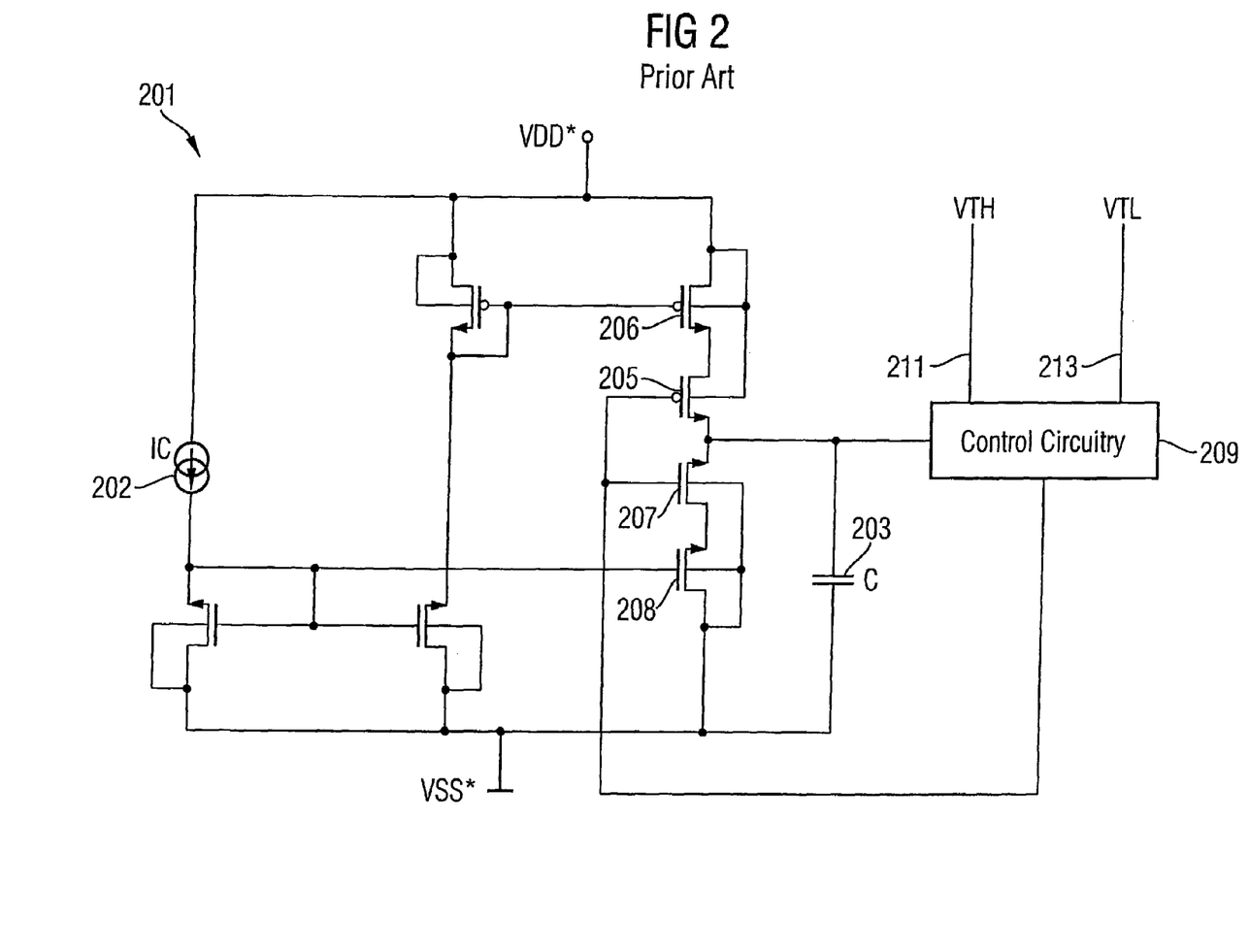
FIG. 2 is a diagram of a single-capacitor relaxation-type current-controlled oscillator (CCO) of the prior art.

FIG. 2 shows a prior-art relaxation type current-controlled oscillator (CCO) 201 with a single timing capacitor 203 suitable for use in tunable oscillator applications, for example in the VCO 18 of FIG. 1. The frequency of the CCO 201 is adjusted using the current control source IC 202. A p-channel CMOS transistor 205 and an n-channel CMOS transistor 207 have their drains coupled to the capacitor 203. These transistors 205, 207 serve as switches for allowing current to enter and leave the capacitor 203. A p-channel CMOS transistor 206 has its source coupled to the drain of the transistor 205 and an n-channel CMOS transistor 208 has its source coupled to the drain of the transistor 207. These transistors 206, 208 act as current sources for supplying current to and withdrawing current from the capacitor 203. Control circuitry 209 is coupled to both the gates and drains of the transistors 205, 207 as well as to the capacitor 203. The control circuitry 209 alternatively switches the transistors 205 and 207 on and off, allowing the transistors 206 and 208 to charge and discharge the capacitor 203. The voltage on the capacitor 203 oscillates between an upper threshold voltage VTH 211 and a lower threshold voltage VTL 213 provided by the control circuitry 209. If VTH 211 and VTL 213 are closer together then the frequency of the CCO 201 is higher and vice-versa.

Figure 3:
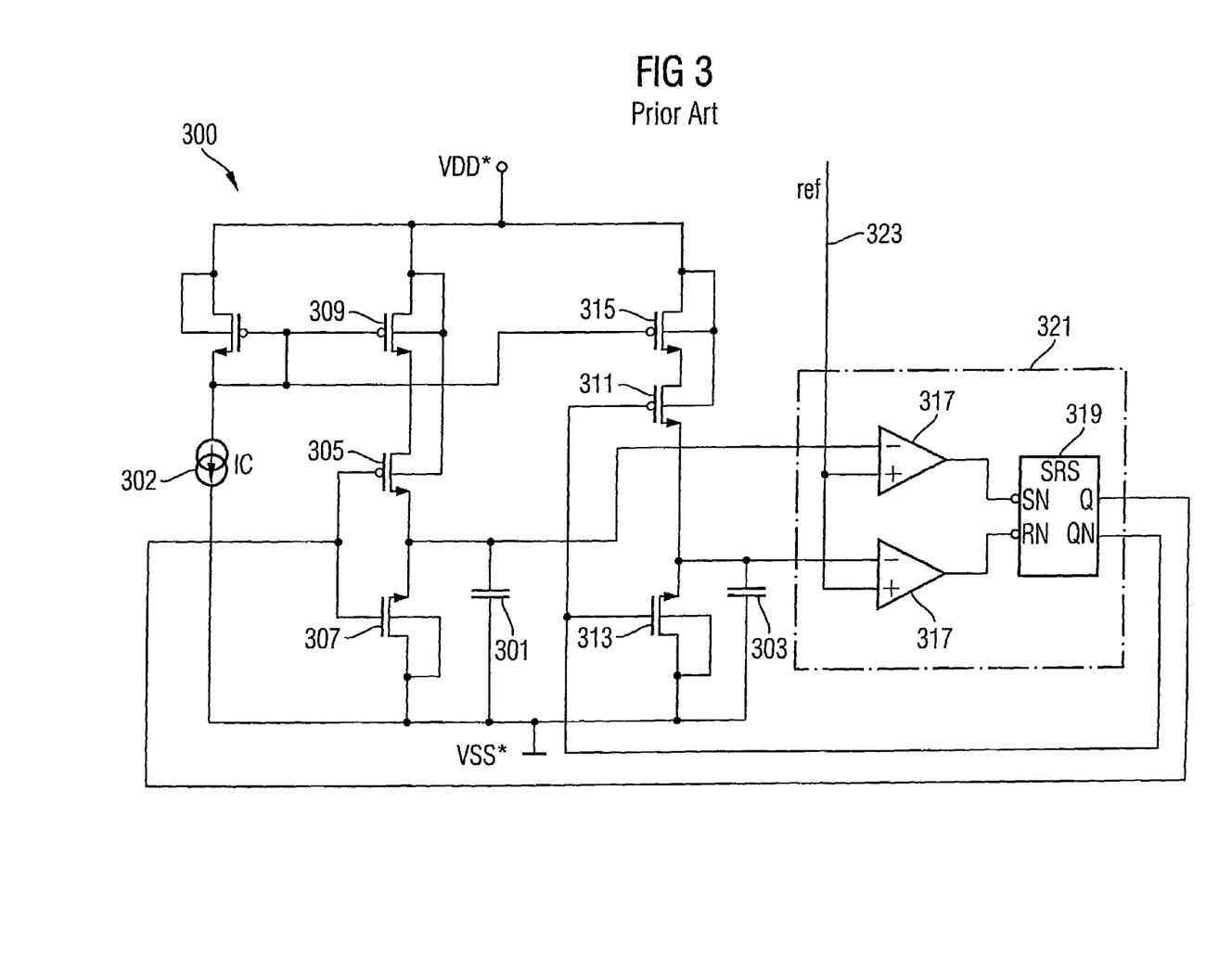
FIG. 3 is a diagram of a double capacitor relaxation-type CCO of the prior art.

FIG. 3 shows a prior-art relaxation type CCO 300 with double timing capacitors 301 and 303. The frequency of the CCO 300 is adjusted using the current control source IC 302.

A p-channel CMOS transistor 305 and an n-channel CMOS transistor 307 have their sources coupled to the capacitor 301. These transistors 305, 307 serve as switches for allowing current to enter and leave the capacitor 301. A p-channel CMOS transistor 309 has its source coupled to the drain of the transistor 305. This transistor acts as a current source for supplying current to the capacitor 301.

A p-channel CMOS transistor 311 and an n-channel CMOS transistor 313 have their sources coupled to the capacitor 303. These transistors 311, 313 serve as switches for allowing current to enter and leave the capacitor 303. A p-channel CMOS transistor 315 has its source coupled to the drain of the transistor 311. This transistor acts as a current source for supplying current to the capacitor 303.

Control circuitry 321 is implemented using two comparators 317 and a digital flip-flop 319. The control circuitry 321 is coupled to both the gates and sources of the transistors 305, 307 as well as to the capacitor 301. The control circuitry 321 alternatively switches the transistors 305, 307 on and off, allowing the transistor 309 to charge the capacitor 301 and allowing the capacitor 301 to discharge to ground.

The control circuitry 321 is also coupled to the gates and sources of the transistors 311, 313 as well as to the capacitor 303. The control circuitry 321 alternatively switches the transistors 311, 313 on and off, allowing the transistor 315 to charge the capacitor 303 and allowing the capacitor 303 to discharge to ground.

The voltage of the capacitors 301, 303 reaches a level determined by a reference or threshold voltage Vref 323 input into the control circuitry 321.

To begin with, if the transistor 305 is on and the transistor 307 is off, then the capacitor 301 is charged by a current provided by the transistor 309.

Eventually the voltage on the capacitor 301 reaches the reference or threshold voltage Vref 323 causing the output of the comparator 317 to switch and causing the flip-flop 319 to switch the output to the gates. Thus, the transistor 305 is turned off and the transistor 307 is turned on: With the transistor 305 turned off, the transistor 309 no longer supplies current to the capacitor 301. With the transistor 307 turned on, the capacitor 301 is discharged to ground through the transistor 307. The capacitor 301 begins to recharge once the voltage on the other capacitor 303 reaches the reference or threshold voltage Vref 323, causing the flip-flop to switch the on/off states of the transistors 305, 307.

As for the capacitor 303, if the transistor 311 is on and the transistor 313 is off, then the capacitor 303 is charged by a current provided by the transistor 315. Eventually the voltage on the capacitor 303 reaches the reference or threshold voltage Vref 323 causing the output of the comparator 317 to switch and causing the flip-flop 319 to switch the output to the gates. Thus, the transistor 311 is turned off and the transistor 313 is turned on. With the transistor 311 turned off, the transistor 315 no longer supplies current to the capacitor 303. With the transistor 313 turned on, the capacitor 303 is discharged to ground through the transistor 313. The capacitor 303 begins to recharge once the voltage on the other capacitor 301 reaches the reference voltage Vref 323, causing the flip-flop to switch the on/off states of the transistors 311, 313.

Because the capacitor 301 is begins to charge again when the voltage on the capacitor 303 reaches the reference voltage Vref 323, and the capacitor 303 begins to charge again when the voltage on the capacitor 301 reaches the reference voltage Vref 323, the capacitors 301 and 303 charge and discharge 180 degrees out of phase with each other. The frequency of the CCO 300 is determined by the charging and discharging of the capacitors.

Compared to the single-capacitor CCO 201 of FIG. 2, the double-capacitor CCO 300 has improved performance for use in applications such as in the tunable oscillator 18 of FIG. 1.

1. The double-capacitor CCO 300 requires only one threshold voltage while the single-capacitor CCO 201 requires an upper and lower threshold voltage.

2. The double-capacitor CCO 300 can provide a capacitor voltage having a greater amplitude than can the single-capacitor CCO 201 because the CCO 300 capacitor can have a voltage range from approximately 0V to the threshold voltage while the CCO 201 capacitor can only have a voltage range from the low threshold voltage to the high threshold voltage. The low threshold voltage has to be greater than zero in order for the circuit components to function, resulting in the smaller amplitude of the capacitor voltage.

3. It is much easier to obtain a 50% duty cycle with the CCO 300 than with the CCO 201.

It can be seen from FIG. 3 that there will be some delay $T_d$ between the time the capacitor voltages reach the reference voltage Vref 323 and the time the transistors are switched between on and off. This delay $T_d$, also called propagation delay, is caused by delays in the electronic components such as the time it takes for the comparators 317 to compare the input signals, the time for the flip-flop 319 to change states and the time it takes the transistors 305, 307, 311, 313 to switch between on and off.

In the double-capacitor CCO 300, if delay $T_d$ caused by the comparators 317, flip-flop 319 and transistors is ignored, the output frequency is directly proportional to the control current as:

$$f_{ideal} = \frac{I_C}{2CV_{ref}}. \quad (1)$$

It can be seen that the frequency is linearly dependent on the control current as expected. Also, as the reference voltage decreases the frequency increases. This is because the capacitor performs a charging/discharging cycle more quickly if it is not charged to as high a voltage. Also, as the capacitance decreases the frequency increases. This is because a capacitor having lower capacitance also performs a charging/discharging cycle more quickly.

Actually, the delay $T_d$ caused by the comparators 317, flip-flop 319 and transistors cannot be ignored, and this delay introduces nonlinearity into the control characteristic of the CCO 300. The actual frequency can be related to the ideal frequency by:

$$f_{actual} = \frac{f_{ideal}}{1 + T_d f_{ideal}}. \quad (2)$$

Figure 4:
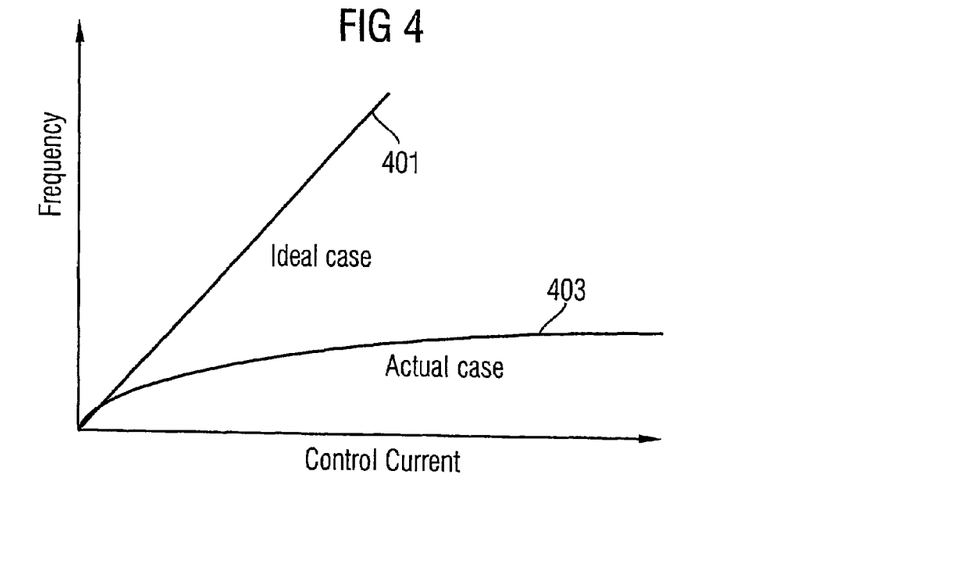
FIG. 4 is a graph showing the effects of propagation delay (e.g. caused by comparators and switches) on the oscillator gain characteristic.

As shown in FIG. 4, while the oscillator gain characteristic 401 for the ideal case is linear, the oscillator gain characteristic 403 for the actual case is no longer linear and in fact falls off substantially at higher frequencies.

Figure 5:
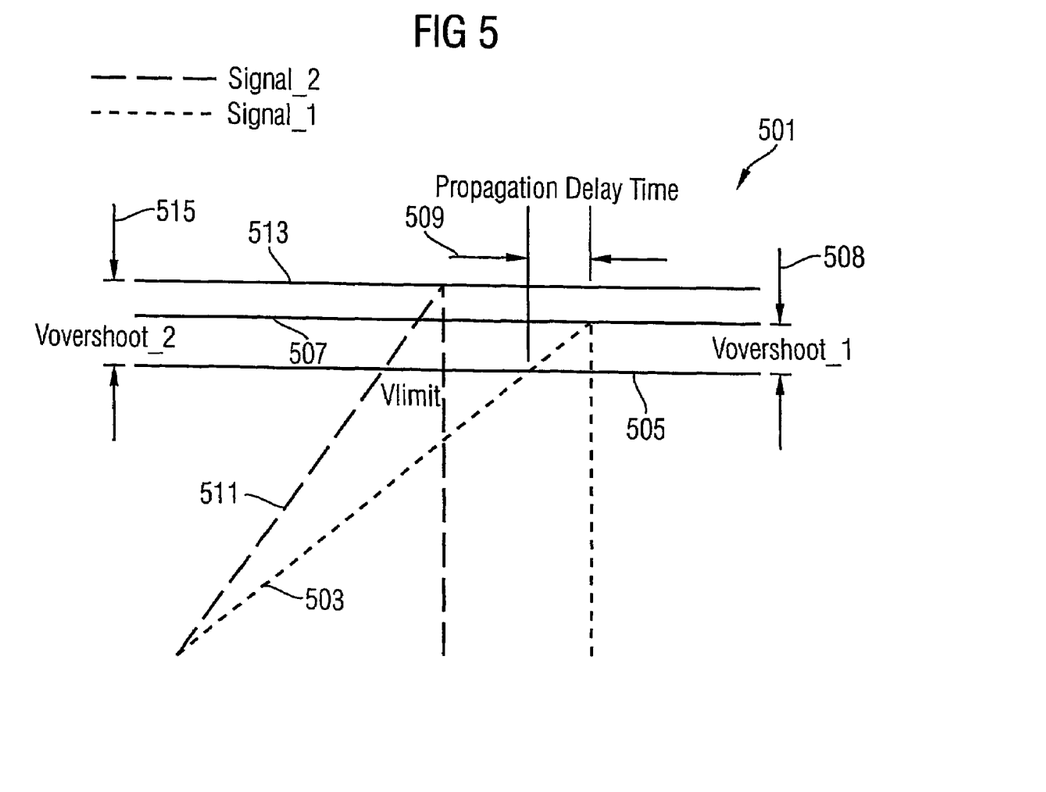
FIG. 5 is a graph of capacitor voltage as a function of time to illustrate the voltage overshoot caused by the propagation delay.

The nonlinear gain characteristic is partly a result of the delay $T_d$ causing a voltage overshoot of the capacitor voltage. This voltage overshoot is illustrated by FIG. 5, which is a graph 501 of capacitor voltage, for example the capacitor 301, as a function of time. A voltage signal 503 can represent the rising and falling voltage on the capacitor 301. In the ideal situation the voltage 503 increases to the reference or threshold voltage level 323 (illustrated as the voltage level 505). Upon reaching the voltage level 505, the transistors 305, 307 receive voltages from the control circuitry 321 changing their state from on to off and off to on. In the ideal case this will cause the capacitor to discharge upon reaching the voltage level 505 and will result in the ideal CCO 300 oscillation frequency. However, due to the propagation delay, the voltage signal 503 continues to increase for a propagation delay time 509 and reaches a voltage level 507 greater than the voltage level 505 before the capacitor 301 discharges. The overshoot voltage 508 is the difference between the voltage levels 505 and 507.

The voltage-overshoot problem becomes more severe as the current from the current control source IC 302 increases, leading to the nonlinear oscillator gain characteristic 403 of FIG. 4. The voltage signal 511 represents the rising voltage on the capacitor for a higher current from the current control source IC 302. The propagation delay time is the same as for the voltage signal 503, but because of the greater current from the current control source IC 302, the voltage rises all the way to a voltage level 513 during the propagation delay time. This results in an overshoot voltage 515 given by the difference between the voltage levels 513 and 505. Thus, as the current from the current control source IC 302 increases, the oscillator gain decreases, approaching a limiting oscillation frequency.

The same analysis holds true for the capacitor 303 and the transistors 311, 313.

This nonlinear characteristic makes it difficult to control the output frequency by varying l, and also makes it difficult to control the gain or sensitivity.

In view of the above, there is a need for a tunable oscillator having an improved voltage-to-frequency characteristic and a more precisely controllable output frequency.

SUMMARY OF THE INVENTION

The present invention uses a variable reference voltage to compensate for propagation delay in a current controlled oscillator caused by delays in the electronic components. The result is an improved voltage-to-frequency characteristic (gain) over a broad range of control currents and output frequencies, and a more precisely controllable output frequency. The reference voltage is decreased as the control current increases and is varied in frequency to match the phase of the oscillator.

In more general terms, the present invention comprises a tunable oscillator having linear gain over a broad frequency range. A control supply, for example a control current source, outputs a control output, for example a control current, for tuning the tunable oscillator. An oscillator circuit outputs a frequency which increases with increasing control output. A control circuit controls the frequency of the oscillator circuit in response to a comparison, using a comparator, for example, of an oscillator circuit signal with a reference signal. A propagation delay compensation circuit varies the amplitude of the reference signal at substantially the same frequency as the oscillator to compensate for propagation delay of signals from the control circuit to the oscillator circuit.

BRIEF DESCRIPTION OF THE FIGURES

Further preferred features of the invention will now be described for the sake of example only with reference to the following figures, in which.

DETAILED DESCRIPTION OF THE EMBODIMENTS

Figure 6:
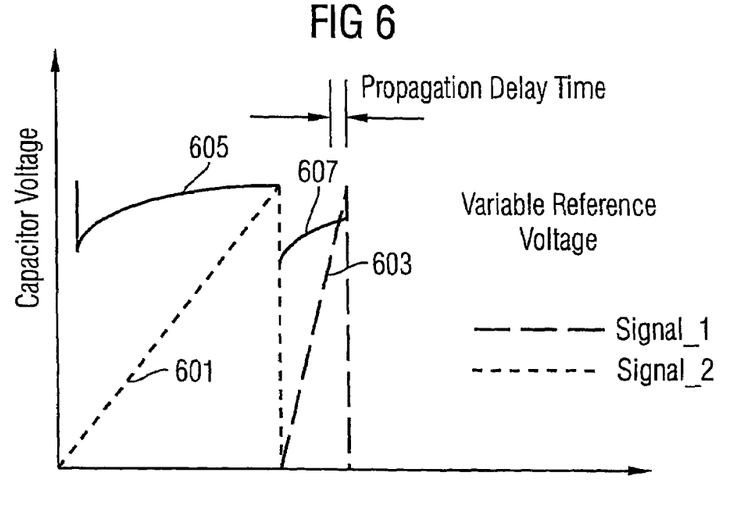
FIG. 6 is a graph of capacitor voltage as a function of time for two different control current levels illustrating the variable threshold voltage for compensating the propagation delay.

The present invention solves the propagation delay time problem in tunable oscillators such as the relaxation type CCO 300 with double timing capacitors 301 and 303 of FIG. 3 by providing a variable reference voltage to replace the constant reference or threshold voltage 505 of FIG. 5 used in the circuit. The reference voltage is varied to decrease more for larger CCO control currents than for smaller CCO control currents. FIG. 6 is a graph of capacitor voltage as a function of time for two different control current levels illustrating the present invention's variable threshold voltage for compensating the propagation delay. A capacitor voltage signal 601 produced by a lower level first control current is shown next to a more quickly rising capacitor voltage signal 603 produced by a higher level second control current. A reference voltage 607 is lowered relative to a reference voltage 605. By using a lower reference voltage 607 with the larger control current, and a higher reference voltage 607 with the smaller control current, the capacitor voltage signals 601 and 603 are made to peak at the same level. Thus, the oscillation frequency produced by the higher current is raised. Additionally, the reference voltage values 605, 607 are made to vary in phase with the capacitor voltages 601, 603, respectively.

Figure 7:
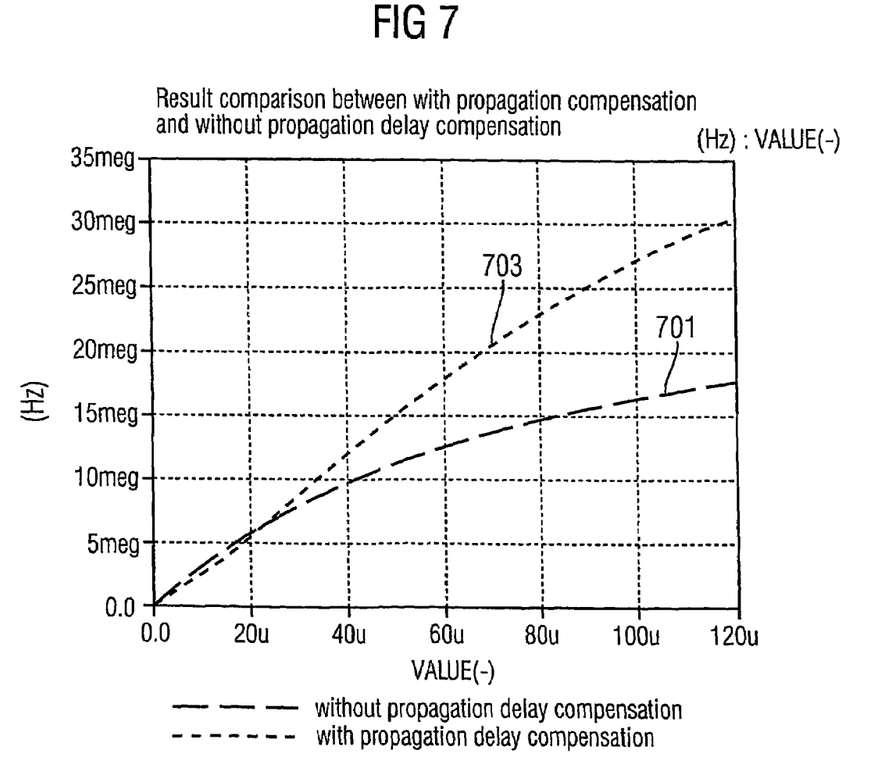
FIG. 7 is a graph showing the improved linearity of the oscillator gain characteristic resulting from the propagation delay compensation of the present invention compared to a graph showing the oscillator gain of the prior art.

FIG. 7 is a graph showing the improved linearity of the oscillator gain characteristic resulting from the propagation delay compensation of the present invention compared to a graph of the prior-art gain. The oscillator gain characteristic 701 shows the nonlinear gain of a tunable oscillator without the variable reference voltage. The oscillator gain characteristic 703 shows the improved linear gain of a tunable oscillator using the variable reference voltage. As can be seen, the linear gain of the curve 703 extends into the higher frequency ranges.

Figure 8:
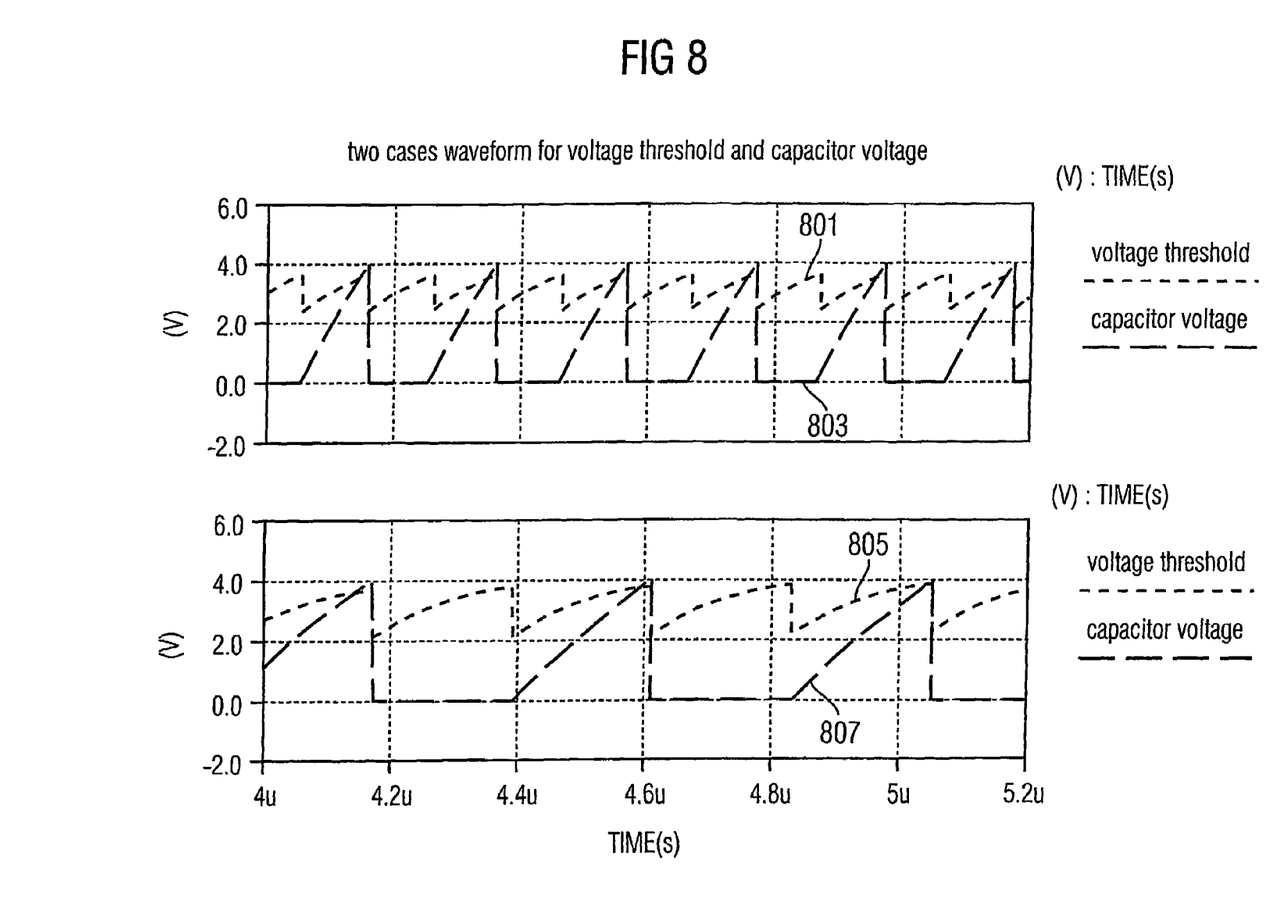
FIG. 8 includes two graphs illustrating the variable threshold voltage and the capacitor voltage for two different control current levels.

FIG. 8 includes two graphs illustrating the variable threshold voltage and the capacitor voltage for two different control current levels. The curve 803 shows the capacitor voltage for a relatively higher oscillator control current while the curve 807 shows the capacitor voltage for a relatively lower control current. The capacitor is charged more quickly in the case of the curve 803 than in the case of the curve 807.

The curve 801 shows the variable threshold voltage for the higher control current case while the curve 805 shows the variable threshold voltage for the lower control current case. The threshold voltages 801, 805 are shown as performing two oscillation cycles for each single oscillation cycle of the capacitor voltages 803, 807. This is because for clarity the capacitor voltages are only shown for one of the capacitors. Actually there. is an additional oscillation peak belonging to the second capacitor, between each of the capacitor oscillation peaks. Thus there is a voltage threshold oscillation peak for each of the two capacitors oscillation peaks.

As can be seen from the figure, the variable voltage thresholds make the capacitor voltages 803, 807 peak at the same voltage level even though the control currents are varied. Thus the method compensates for the propagation delay in the tunable oscillator to provide linear gain.

Figure 9:
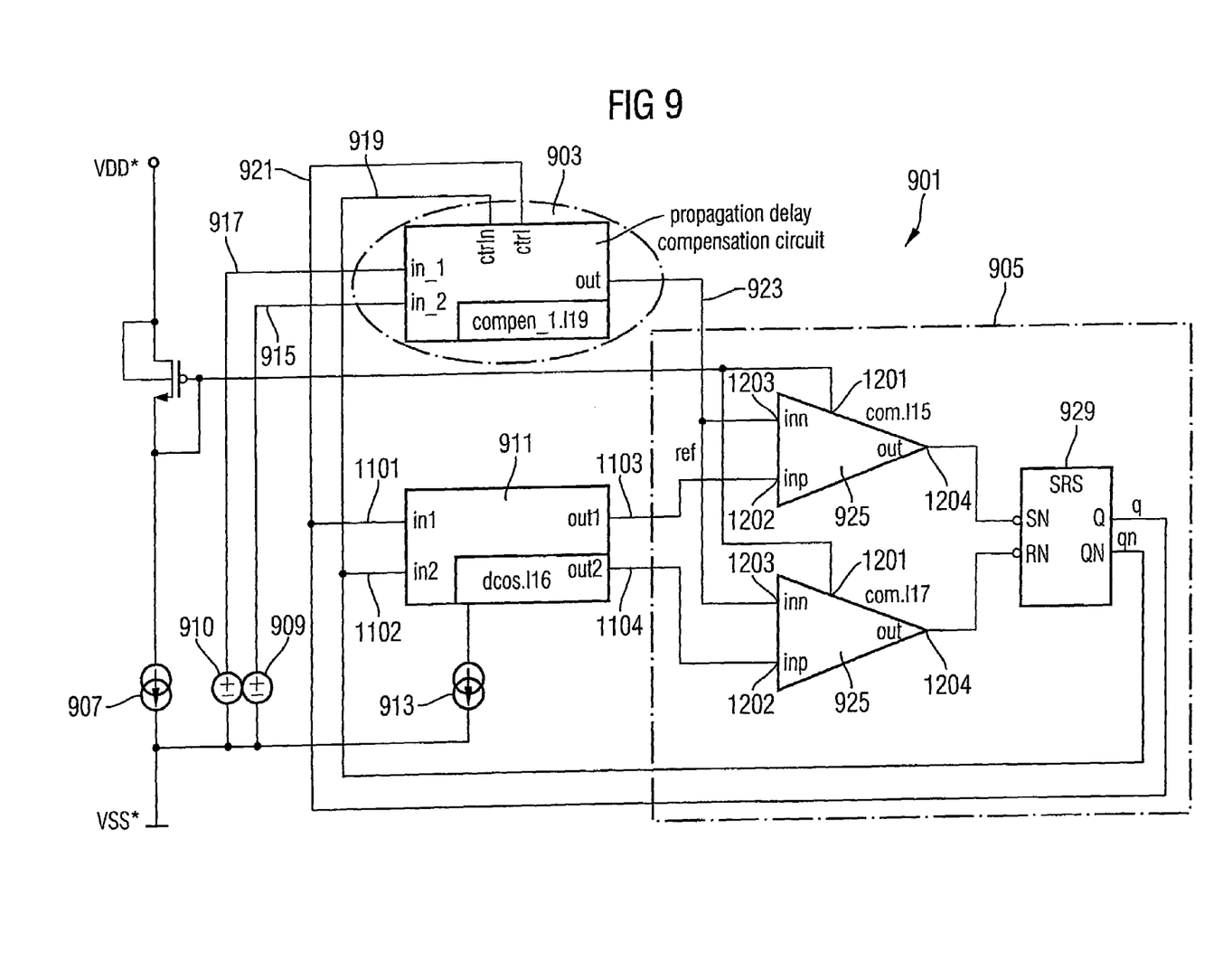
FIG. 9 is a circuit diagram illustrating the placement of the propagation delay compensation circuit in a double capacitor relaxation-type CCO similar to the CCO of FIG. 2.

FIG. 9 is a circuit diagram of a tunable oscillator 901 for implementing the variable voltage threshold propagation delay compensation of the present invention by placing a propagation delay compensation circuit 903 in a double capacitor relaxation-type CCO essentially the same as the CCO 300 of FIG. 3. For simplicity of illustration, the details of the propagation delay compensation circuit 903 are separately shown in FIG. 10, the details of the oscillator circuit 911 are separately shown in FIG. 11 and the details of the comparators 925 are separately shown in FIG. 12. Although there are two comparators 925, they are illustrated using the same reference numbers, rather than different reference numbers, since in most applications the same type of comparator will be used for both.

Figure 11:
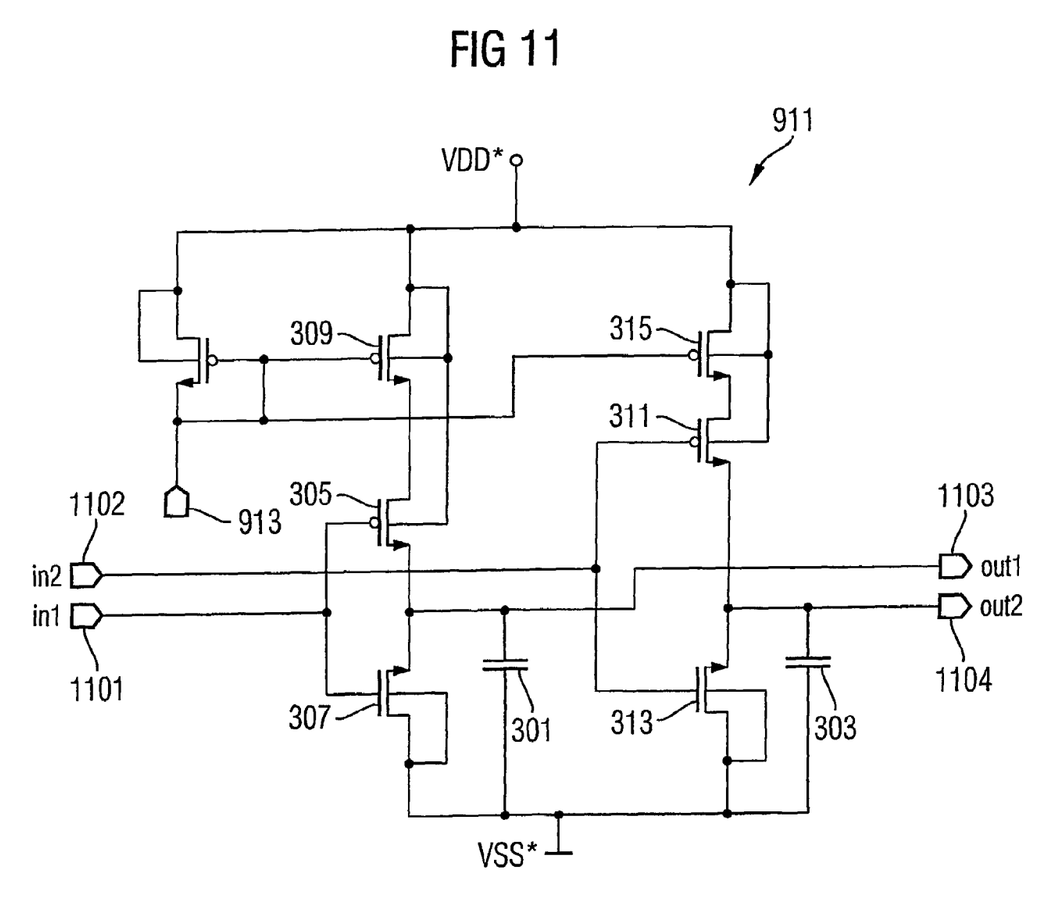
FIG. 11 is a more detailed view of the oscillator circuit of FIG. 9.

The oscillator circuit 911 of FIGS. 9 and 11 can be the same as that used in the prior art of FIG. 3. Control circuitry 905 (same as the control circuitry 321 in FIG. 3) provides outputs through leads 1101, 1102 to the oscillator circuit 911. A control current 913 is supplied to the oscillator circuit 911 for charging the capacitors 301, 303 of FIG. 11 as in FIG. 3. The oscillator circuit 911 has leads 1103, 1104 for providing voltage signals to the leads 1202 of comparators 925 of the control circuitry 905. The comparators 925 provide outputs to a flip-flop 929 through leads 1204.

Figure 12:
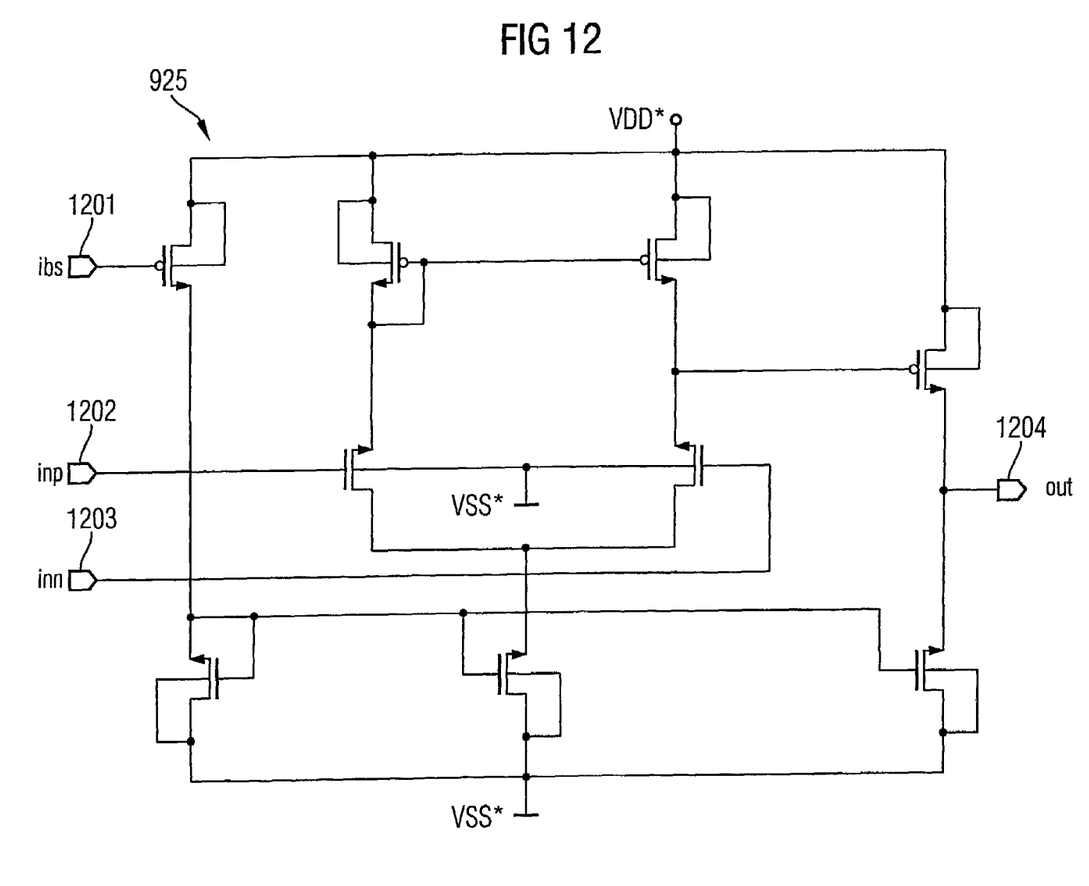
FIG. 12 is a more detailed view of the comparator circuit of FIG. 9.

FIG. 12 shows one of the comparators 925 in more detail. The comparator includes nine transistors. The current source 907 of FIG. 9 supplies current to the comparators 925 through leads 1201. The comparator 925 compares (1) the input to the lead 1202 from the oscillator circuit 911 with (2) a variable reference voltage input to the lead 1203 from a lead 923 of the propagation delay compensation circuit 903. The output of the comparator 1204 is switched depending on the result of the comparison.

Figure 10:
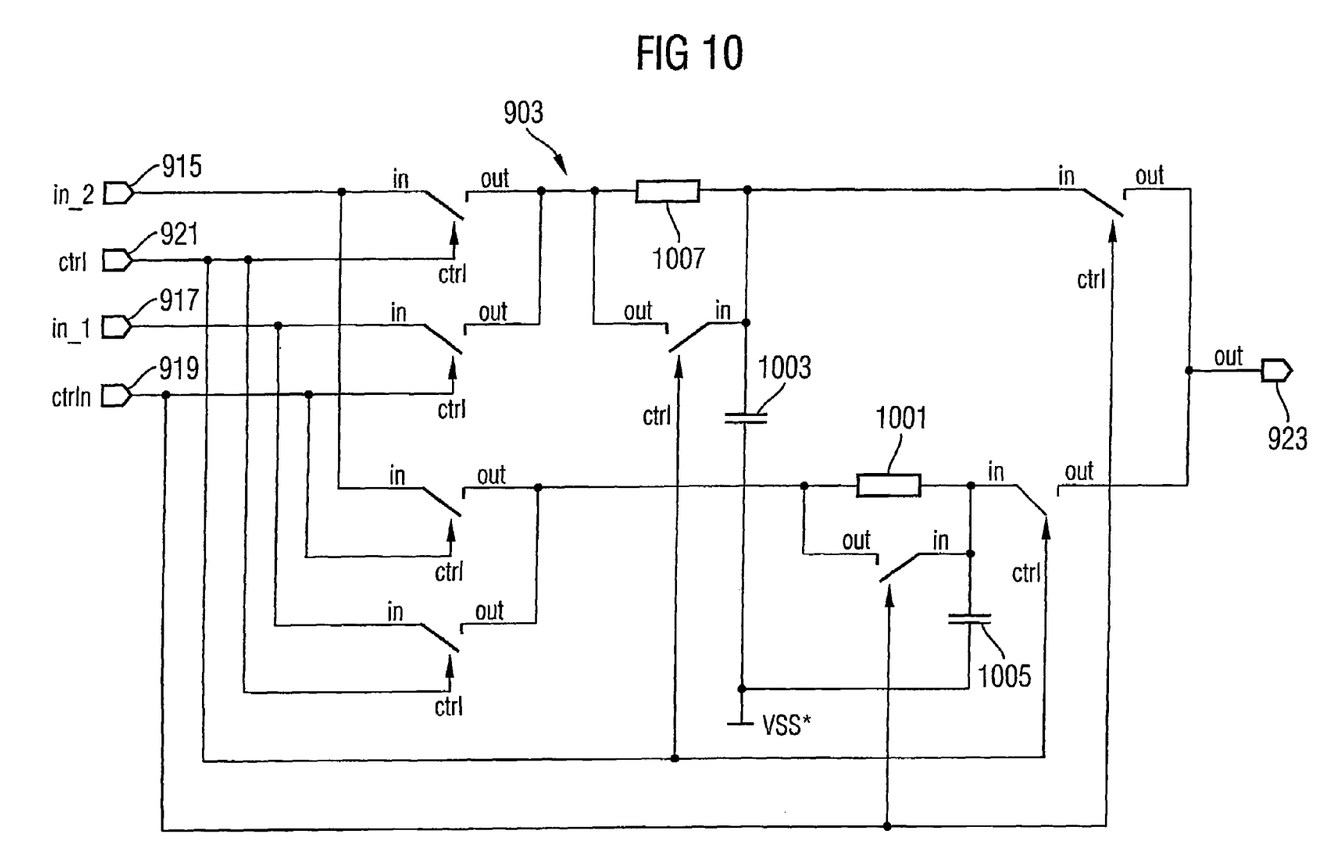
FIG. 10 is a more detailed view of the propagation delay compensation circuit of FIG. 9.

The propagation delay compensation circuit 903 of FIG. 10 serves to output a variable reference voltage through the lead 923 to control circuitry 905. The circuit 903 includes capacitors 1003 and 1005 which alternately charge and discharge through resistors 1001 and 1007 in response to switches triggered by inputs 919, 921 to produce voltage reference signals 801, 805 such as in FIG. 8. Two capacitors are used so that the circuit can vary the reference voltage in phase with voltage levels on the double capacitors 301, 303 of the oscillator circuit 911. The inputs 919, 921 are provided by the control circuit 905. These inputs are the same signals that trigger the gates of the transistors 305, 307, 311, 313 of the oscillator circuit 911 of FIG. 11 through the leads 1101, 1102 (same as the signals output by the flip-flop 319 of the control circuitry 321 of FIG. 3). The circuit 903 receives as input a lower reference voltage from the voltage source 909 through the lead 915. The circuit also receives as input an upper reference voltage through a lead 917 from the voltage source 910.

The control circuitry inputs 919 and 921 cause the propagation delay compensation circuit 903 to switch between the lower and upper reference voltage inputs 915, 917 in phase with the oscillations of the double capacitors 301, 303 of the oscillator circuit 911. The circuit 903 thus provides a signal, such as the variable reference voltages 801, 805 of FIG. 8, from the output 923.

The values of the voltage sources 909, 910, capacitors 1003, 1005 and resistors 1001, 1007 are chosen so that the amplitude and phase of the variable reference voltage output 923 will cause the voltage on the oscillator circuit 911 capacitors 301, 303 to peak at approximately the same value over a broad. range of input control currents 907 (or 302 in FIG. 3). This results in a linear oscillator gain over a broad frequency range.

In the illustrated embodiments, other combinations and modifications are possible. The invention is by no means limited to double-capacitor type tunable oscillators. For example, using a few modifications, the same invention can be applied to single-capacitor relaxation-type current-controlled oscillators (CCO). The present invention can be helpful for increasing the linearity of the gain when used with many different types of tunable oscillators having propagation delay problems. Also, different particular arrangements of the electronic components can be used while still producing a variable voltage reference for providing more linear oscillator gain. Thus, although the invention has been described above using particular embodiments, many variations are possible within the scope of the claims, as will be clear to a skilled reader.

I claim:

1. A tunable oscillator comprising:
   a control supply configured to output a control output operable to tune the tunable oscillator;
   an oscillator circuit configured to output a signal such that a frequency of the signal increases with increasing control output;
   a control circuit configured to control the frequency of the oscillator circuit signal in response to a comparison of the oscillator circuit signal with a reference signal; and
   a propagation delay compensation circuit configured to vary an amplitude of the reference signal at substantially the same frequency as the oscillator circuit signal to compensate for propagation delay of signals from the control circuit to the oscillator circuit, wherein the propagation delay compensation circuit is further configured to vary the amplitude of the reference signal by oscillating such that a signal is produced that is in phase with the signal output by the oscillator circuit.

2. The tunable oscillator of claim 1, wherein the control supply is a current controlled oscillator and the control output is a control current.

3. The tunable oscillator of claim 1, wherein the oscillator circuit comprises at least one capacitor configured to be charged and discharged in response to a comparison of a voltage of the capacitor with the reference signal.

4. The tunable oscillator of claim 1, wherein the oscillator circuit comprises two capacitors configured to be alternatively charged and discharged in response to a comparison of the voltages of the capacitors with the reference signal.

5. The tunable oscillator of claim 4, wherein the control circuit comprises two comparators configured to alternatively charge and discharge the two capacitors in response to comparisons of voltages of the capacitors with the reference signal.

6. The tunable oscillator of claim 1, further comprising first and second reference voltages configured to control an amplitude of a reference voltage output by the propagation delay compensation circuit.

7. The tunable oscillator of claim 1, wherein the propagation delay compensation circuit is configured to decrease the amplitude of the reference signal as the control output increases and to increase the amplitude of the reference signal as the control output decreases.

8. The tunable oscillator of claim 2, wherein the amplitude of the reference signal decreases as the control current increases over a range of values and to increase as the control current decreases over the range of values so that a capacitor of the oscillator circuit charges to substantially the same voltage peak over the range of values.

9. A method for compensating the propagation delay in a tunable oscillator comprising the steps of:
inputting a control current to an oscillator circuit, the control current being operable to tune the tunable oscillator;
detecting a signal of the oscillator circuit and comparing the signal to a reference signal from a reference circuit to produce a control signal;
supplying the control signal to both the oscillator and the reference circuit; and
outputting from the reference circuit the reference signal, the reference signal having substantially the same phase as the signal of the oscillator circuit and decreasing in amplitude as the signal of the oscillator circuit increases.

10. The method of claim 9, wherein the oscillator circuit comprises at least one capacitor, and wherein the method further comprises charging and discharging the at least one capacitor in response to a comparison of a voltage of the capacitor with the reference signal.

11. The method of claim 9, wherein the oscillator circuit comprises two capacitors, and wherein the method further comprises alternatively charging and discharging the two capacitors in response to a comparison of voltages of the two capacitors with the reference signal.

12. The method of claim 11, wherein the detecting a signal of the oscillator circuit step further comprises:
detecting the signal of the oscillator circuit using a control circuit, the control circuit comprising two comparators; and
using the two comparators to alternatively charge and discharge the two capacitors corresponding to comparisons of voltages of the capacitors with the reference signal.

13. The method of claim 9, wherein the outputting from the reference circuit the reference signal step further comprises:
varying the amplitude of the reference signal at substantially the same frequency as the oscillator circuit signal in a propagation delay compensation circuit.

14. The method of claim 13, further comprising:
inputting a first and second reference voltage to the propagation delay compensation circuit;
controlling the amplitude of the reference signal corresponding to the first and second reference voltages in the propagation delay compensation circuit.

15. The method of claim 13, further comprising:
oscillating the propagation delay compensation circuit to vary the amplitude of the reference signal.

16. The method of claim 13, further comprising:
using the propagation delay compensation circuit to decrease the amplitude of the reference signal as the control current increases and increasing the amplitude of the reference signal as the control current decreases.

17. A tunable oscillator comprising:
a control supply configured to output a control current operable to tune the tunable oscillator;
an oscillator circuit configured to output a signal such that a frequency of the signal increases with increasing control current;
a control circuit configured to control the frequency of the oscillator circuit signal in response to a comparison of the oscillator circuit signal with a reference signal; and
a propagation delay compensation circuit configured to output a variable reference signal such that the reference signal has substantially the same phase as the oscillator circuit signal and decreases in amplitude as the signal of the oscillator circuit increases.

18. The tunable oscillator of claim 17, wherein the oscillator circuit comprises two capacitors configured to be alternatively charged and discharged in response to a comparison of voltages of the capacitors with the reference signal.

19. The tunable oscillator of claim 18, wherein the control circuit comprises two comparators configured to alternatively charge and discharge the two capacitors in response to comparisons of voltages of the capacitors with the reference signal.

* * * * *